United States Patent [19]

Anschel et al.

[11] Patent Number: 4,914,551
[45] Date of Patent: Apr. 3, 1990

[54] ELECTRONIC PACKAGE WITH HEAT SPREADER MEMBER

[75] Inventors: Morris Anschel, Binghamton; Bahgat G. Sammakia, Johnson City, both of N.Y.

[73] Assignee: International Business Machines Corporation, Armonk, N.Y.

[21] Appl. No.: 218,725

[22] Filed: Jul. 13, 1988

[51] Int. Cl.$^4$ .............................................. H02B 1/00
[52] U.S. Cl. ................................... 361/389; 361/386; 357/81
[58] Field of Search ............... 361/398, 408, 412, 386, 361/387, 388, 389; 357/81; 165/80.3, 185; 174/16.3

[56] References Cited

U.S. PATENT DOCUMENTS

| | | | |
|---|---|---|---|
| 4,004,195 | 1/1977 | Harayda et al. | 357/81 X |
| 4,239,502 | 12/1980 | Slack et al. | 51/295 |
| 4,256,792 | 3/1981 | Koepke et al. | 428/119 |
| 4,283,464 | 8/1981 | Hascoe | 428/594 |
| 4,415,025 | 11/1983 | Hovarth | 165/185 |
| 4,509,096 | 4/1985 | Baldwin et al. | 361/386 |
| 4,593,342 | 6/1986 | Lindsay | 361/386 |
| 4,612,601 | 9/1986 | Watari | 361/387 |
| 4,700,273 | 10/1987 | Kaufman | 361/388 |
| 4,750,089 | 6/1988 | Derryberry et al. | 361/388 |
| 4,764,804 | 8/1988 | Sahara et al. | 357/81 |

FOREIGN PATENT DOCUMENTS

2511193 11/1983 France .

OTHER PUBLICATIONS

IBM TDB, vol. 19, No. 9 (2/77), p. 3321—"Modular Organic Carrier", (N. C. Arvanitakis).
IBM TDB, vol. 20, No. 4 (9/77), p. 1433—"Controlled Gap in Semiconductor Packages", (V. Y. Doo et al.).
IBM TDB, vol. 20, No. 4 (9/77), pp. 1438, 1439—"High Performance Single Chip Module" (V. Y. Doo et al.)
IBM TDB, vol. 21, No. 1 (6/78), pp. 99, 100—"Circuit Chip Support Assembly with Fatigue-Resistance Epoxy Bond" (V. D. Coombs et al).
IBM TDB, vol. 24, No. 1A (6/81), p. 14—"Heat Spreader with Thermal Grease", (W. A. Camp et al).
IBM TDB, vol. 27, No. 11 (4/85), p. 6382—"Copper-Clad Invar Heatsink".

Primary Examiner—A. D. Pellinen
Assistant Examiner—David Osborn
Attorney, Agent, or Firm—Lawrence R. Fraley

[57] ABSTRACT

An electronic package (10) including a first circuitized substrate 11 (e.g., printed circuit board) having connected thereto a second, flexible circuitized substrate (e.g., polyimide with chrome-copper-chrome circuitry thereon). The second substrate is in turn electrically connected to the invention's semiconductor device (e.g., silicon chip), which device in turn is attached to a heat spreader (37) for providing effective heat transference from the device to the package's heat sink (33). The heat sink is attached to the first substrate (e.g., using solder). Significantly, the coefficients of thermal expansion of the heat spreader, semiconductor device and adhesive used to connect same are substantially similar, around 2 to 5 ppm/degree Kelvin ($\times 10^{-6}$ m/m degrees Kelvin), in order to provide an effective heat path from the heat-generating device to the corresponding, much larger heat sink.

19 Claims, 2 Drawing Sheets

ELECTRONIC PACKAGE WITH HEAT SPREADER MEMBER

TECHNICAL FIELD

The invention relates to electronic packages and particularly to electronic packages which utilize a heat sink as part thereof. As defined below, the invention even further relates to electronic packages which utilize a thin film, flexible circuitized substrate as one element thereof.

BACKGROUND OF THE INVENTION

Electronic packages which include semiconductor devices (e.g., silicon chips) as part thereof are well known in the computer industry, with examples being shown and described in U.S. Letters Pats. 4,004,195 (Harayda et al), 4,415,025 (Horvath) and 4,593,342 (Lindsay).

Use of high circuit densities in modern semiconductor devices, including particularly those which use the aforementioned thin film substrates, requires the effective removal of heat generated during package operation in order to assure that the operating parameters of such devices are maintained within specified tolerances so as to prevent destruction of the package from overheating. One well known means for providing such heat removal is to utilize a metallic heat sink or similar member which typically forms an integral part of the package. Representative examples of these means are described and illustrated in the aforementioned patents.

The electronic package of the instant invention provides for enhanced heat removal therefrom through the utilization of a heat spreader interposed between the package's semiconductor device and heat sink components. The device, electrically connected to a thin film, circuitized substrate, is in turn attached to a surface of the spreader which in turn is attached to a surface of the heat sink. Use of a thin film substrate enables the device to be finally oriented at a spaced location from the package's first substrate (e.g., printed circuit board). This arrangement, in addition to substantially promoting heat dissipation from the package also facilitates assembly thereof.

It is believed that an electronic package possessing such features, among others, would constitute a significant advancement in the art.

DISCLOSURE OF THE INVENTION

It is therefore, a primary object of the invention to enhance the art of electronic packaging by providing a package possessing the several advantageous features cited herein.

In accordance with one aspect of the invention, there is provided an electronic package comprising a first circuitized substrate, a semiconductor device positioned above the first circuitized substrate and electronically coupled thereto, a second, circuitized substrate of flexible nature electrically connected to the first substrate and the semiconductor device for providing electrical coupling therebetween, a heat sink for providing heat escape from the package, and a heat spreader for providing an enhanced heat path from the semiconductor device to the heat sink. The heat spreader is secured to the semiconductor device and the heat sink along first and second interfaces, respectively, using an adhesive, the coefficients of thermal expansion of the semiconductor device, the heat spreader, and the adhesive used to secure the heat spreader to the device along the first interface being substantially similar.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
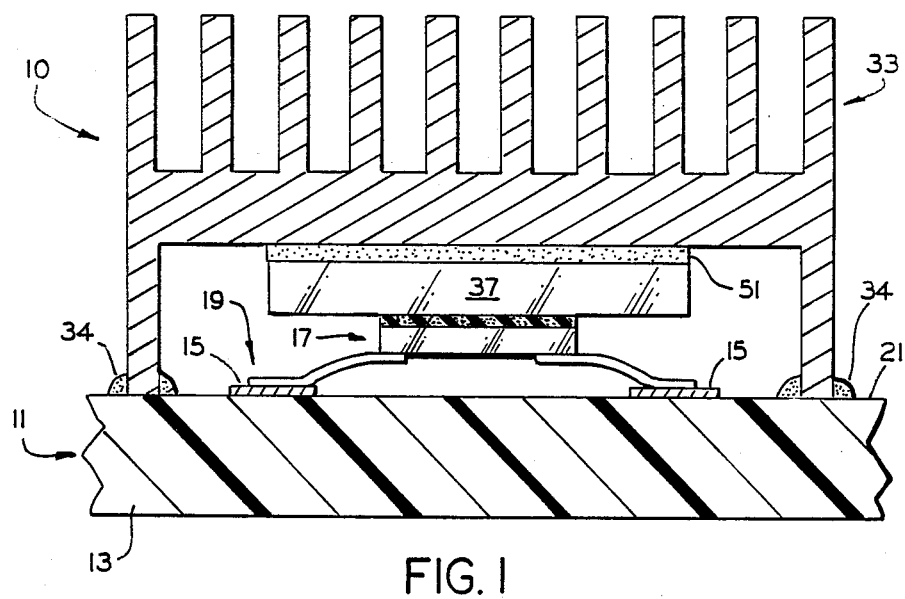
FIG. 1 is a front, elevational view, partly in section, of an electronic package in accordance with a preferred embodiment of the invention.

With particular attention to FIG. 1, there is shown an electronic package 10 in accordance with a preferred embodiment of the invention. Package 10 includes a rigid, first circuitized substrate 11 (e.g., a printed circuit board) comprised of an electrically insulative material (e.g., epoxy) and including a body portion 13 having predefined circuitry 15 (e.g., copper) thereon. A semiconductor device 17 (e.g., silicon chip) is positioned above substrate 11 and electrically coupled thereto, said coupling being provided by a thin film, flexible second circuitized substrate 19 which is electrically connected (e.g., at one end) to circuitry 15 and also connected (e.g., at the other end) to selected contact locations on the bottom (lower) surface of device 17. Understandably, the thin film substrate 19 is a significant part of the invention in that it not only provides the aforementioned coupling between device 17 and substrate 11 but also enables the device to be positioned at a spaced elevation above the upper surface 21 of substrate 11. This spacing is considered significant for manufacturing purposes (e.g., by facilitating flux cleaning during the aforementioned connection of substrate 19 to circuitry 15). Second substrate 19, as better shown in FIG. 2, comprises a thin layer of electrically insulative (e.g., organic polymer) material 23 having thereon conductive, metallic (e.g., chrome-copper-chrome) circuitry 25. Circuitry 25 may be located on either an upper or lower surface of the insulative polymer 23. By the term thin is meant a substrate wherein the overall thickness thereof (including polymer and conductive circuitry) is within the range of only from about 0.001 inch to about 0.010 inch. This element is thus able to provide necessary flexibility at this portion of the invention such that the attached semiconductor device 17, during assembly, can be elevated to the position shown. A further description of the preferred method of assembling the invention is provided below.

Figure 2:
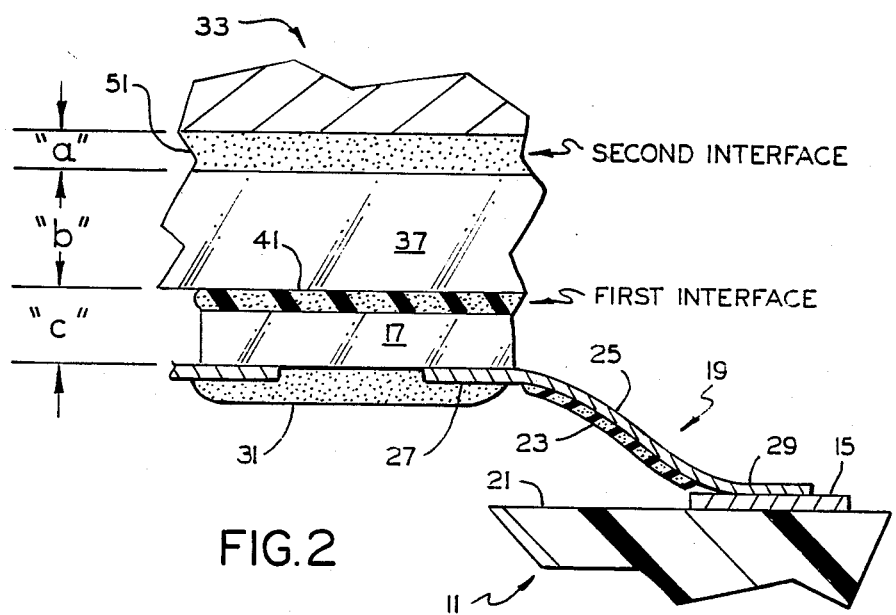
FIG. 2 is a partial view, on an enlarged scale, of the package of FIG. 1.

As shown in FIG. 2, the circuitry 25 of flexible substrate 19 includes projecting end portions 27 and 29 which, as shown, extend beyond the insulative polymer material. Reference numeral 27 represents the first of these projecting end portions which in turn are electrically connected (e.g., using thermal compression bonding) to the respective contact locations on the lower surface of device 17. In addition, the remaining second projecting end portions 29 are electrically connected (e.g., by soldering) to the aforementioned, respective conductive circuit lines 15 located on the upper surface 21 of substrate 11. The aforementioned connection techniques are known in the art and further definition is not believed necessary. Added protection for the semiconductor device having the first projecting ends of substrate 19 attached thereto can be provided through the use of a protective top coating 31 (e.g., silicone or epoxy).

The preferred insulative material 23 for substrate 19 is a thermoset condensation polymer (e.g., polyimide) which is a dielectric, high temperature elastic material known in the art. Alternatively, a thermoplastic, non-condensation polymer could also be utilized. Defined circuitry (e.g., chrome-copper-chrome) is typically in blanket layer format and is secured to the thin film using blanket metallization techniques, followed by photolithographic and etching processes, several of which are known in the art. Further description is thus not believed necessary.

As shown in FIG. 1, package 10 further includes a heat sink 33, which as indicated, is preferably attached to the upper surface 21 of substrate 11 (e.g., using solder 34). The heat sink, in addition to providing heat dissipation for the invention, thus also serves to provide a cover for the package's internal components (e.g., device 17 and substrate 19). In order to provide enhanced heat path between the invention's heat sink and heat-generating semiconductor device component, the invention further includes a heat spreader 37 which, as shown, is secured along one surface thereof to device 17 and along a second, opposing surface thereof to heat sink 33. Thus, the heat spreader is joined to these components along first and second interfaces, respectively, as illustrated in greater detail in FIG. 2. To provide effective heat escape in accordance with the unique teachings of the invention, the heat spreader is selected from a material which possesses a coefficient of thermal expansion substantially similar to that of the attached device 17. By the term substantially similar as used in this regard is meant that the coefficients of thermal expansion of these two elements are identical to each other or wherein the difference in said coefficients is no greater than two parts per million (ppm) per degree Celsius ($\times 10^{-6}$ m/m per degree Kelvin). In a preferred embodiment of the invention, a silicon chip was used for device 17, and heat spreader 37 was selected from silicon carbide, aluminum nitride or copper-clad Invar (a trademark of the International Nickel Company) materials. Use of these materials enabled provision of semiconductor device and heat spreader elements each possessing a coefficient of thermal expansion of about 2.5 ppm/degree Celsius ($\times 10^{-6}$ m/m per degree Kelvin). As stated, the coefficients of thermal expansion of these two elements are preferably identical in order to assure the defined unique heat removal at this juncture of the invention.

To further assure sound heat transfer in accordance with the teachings of the invention, the adhesive material 41 along the defined first interface between device 17 and spreader 37 (and used to secure these two elements) was selected from a material possessing high thermal conductivity and a coefficient of thermal expansion also substantially similar to that of said elements. By the term substantially similar in this regard, however, is meant that the coefficient of thermal expansion of this adhesive does not exceed (differ from) that of either the device 17 or heat spreader by about 3.0 ppm/degree Celsius ($\times 10^{-6}$ m/m per degree Kelvin). More specifically, the coefficients of thermal expansion of all three of these elements (chip, heat spreader, first interface adhesive) fall within the range of about 2.0 to about 5.0 ppm/degree Celsius ($\times 10^{-6}$ m/m per degree Kelvin). In a preferred embodiment, a diamond-filled epoxy was utilized for adhesive 41, this material possessing a coefficient of thermal expansion of about 3.0 ppm/degree Celsius ($\times 10^{-6}$ m/m per degree Kelvin). Additional adhesives possessing a slightly higher coefficient of thermal expansion (up to the aforementioned 5.0) are also possible in order to accomplish the effective heat transfer defined herein. It is thus understood from the foregoing that the coefficient of thermal expansion of adhesive 41 may be somewhat larger than those of the two elements (device and spreader) which it serves to bond together. This is acceptable in the instant invention, provided the adhesive is very thin (e.g., within the range of about 0.001 to about 0.003 inches). Further, the defined material (diamond-filled epoxy) is also electrically insulative, in addition to being highly thermally conductive, as stated.

As particularly shown in FIG. 1, heat spreader 37 is significantly larger than the attached semiconductor device 17. In a preferred embodiment of the invention, heat spreader 37 possessed an overall external surface area at least twice that of the overall outer surface area of device 17. Utilization of such a large element results in an interface between the heat spreader and heat sink which, from a thermal standpoint, is not as sensitive as that interface between the spreader and semiconductor device elements. Therefore, an adhesive possessing a much lower thermal conductivity is acceptable. Accordingly, is not essential in order to provide the advantageous features cited herein that the coefficient of thermal expansion of heat sink 33 match that of spreader 37 or of the interim adhesive 51 used along the defined second interface to secure these components. In a preferred embodiment, when using the defined aluminum nitride or silicon carbide materials for spreader 17 or the defined metallic material (copper-clad Invar), it was possible to utilize known heat sink materials in the art, including aluminum or tin-plated copper. The corresponding adhesive material 51 used along this juncture (second interface) of the invention was, in a preferred embodiment of the invention, silicone filled with a thermal conductive material (e.g., zinc oxide). Alternatively, an epoxy of a type known in the art, also having the aforementioned zinc oxide thermally conductive material as a filler, could also be readily utilized. One such composition, excluding this filler, is available from 3M. under the trade designation "Scotchcast". Such a composition contains about 47.6% by weight of an epoxy polyer, about 52% by weight of a hardener and flexibilizer mixture, and about 0.4% by weight of a coloring agent. The hardener and flexibilizer mixture contains about 25% to 39% of hexahydrophthalic anhydride, about 50% to about 75% by weight of a polypropylene glycol and/or polyoxypropylene glycol flexibilizer, about 0.85% to about 1% by weight of a tertiary amine (e.g., trimethyl amine), and a minor amount of hexahydrophthalic acid resulting from hydrolysis of the corresponding anhydride. The coloring agent employed is generally a mixture of chlorinated copper phthalocyanine on a titanium dioxide pigment. The filler, zinc oxide, is added to complete the composition. Adhesive 51 is used to the extent that it defines a thick interface between elements 33 and 37. By the term thick is meant an interface having a thickness within the range of about 0.003 inch to about 0.009 inch. This thickness is represented by the letter "a" in FIG. 2. Use of the aforementioned material at the thickness defined herein greatly facilitates assembly of the invention (by reducing dimensioned tolerances), particularly regarding the attachment of the invention's heat spreader and heat sink elements.

As stated, heat transference along the invention's second interface is not critical at this location because of the relatively (compared to the size of the invention's chip) large size of the heat spreader. Thus a lower thermal conductivity is possible, as determined by the formula $R_T = LL/KA$, wherein $R_T$ equals the thermal resistance (across the interface), L equals the length of the heat path across the spreader's width, K equals the adhesive's thermal conductivity, and A is the cross-sectional area (of the adhesive). Usng the aforementioned materials and corresponding thicknesses (see also below), a thermal resistance within the range of about 0.05°C./watt to about 0.5°C./watt across the second interface was measured. This is slightly higher than the thermal resistance (about 0.03°C./watt to about 0.15°C./watt) across the invention's first interface (wherein heat transference is deemed critical).

When using an adhesive 51 having a thickness defined above, the corresponding thicknesses for the heat spreader 37 (dimension "b" in FIG. 2) is preferably within the range of about 0.0025 to about 0.0055 inch while that of the corresponding adhesive 41 was within the range of about 0.001 to about 0.003 inch (the device 17 having a thickness of about 0.0025 inch). It is of course understood that both adhesives used in the invention's two interfaces solidify (become rigid) upon curing thereof.

Figure 4:
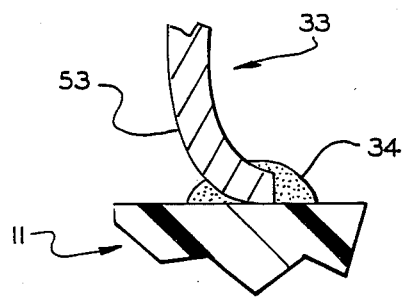
FIG. 4 is a partial view of an alternative embodiment of leg segments which may be used as part of the heat sink of the invention.

Assembly of the invention is accomplished by firstly attaching the defined semiconductor device 17 to the flexible circuitized substrate 19. This is first achieved by bonding the aforementioned projecting end portions 27 of the flexible substrate to the respective contact locations of the device. Thereafter, device 17 is secured to heat spreader 37 using the defined adhesive 41. This is readily accomplished, for example, by inverting the heat spreader and precisely aligning the chip thereon. Subsequently, the projecting second end portions 29 of the flexible substrate 19 are attached to the respective circuit elements 15 on substrate 11. This subassembly in position, heat sink 33 is then located atop same and the heat spreader 37 secured to substrate 11. This may be achieved by positioning the aforementioned adhesive 51 on the under surface of the heat sink or on the heat spreader's upper surface as illustrated in FIG. 1. Alternatively, adhesive can he applied to both of these surfaces. Assembly of the heat sink to the heat spreader and substrate 11 can be facilitated through the provision of curved lower leg segments 3 for the heat sink. Such curved segments are illustrated in FIG. 4 and enable the heat sink to be depressed downward to facilitate the defined contact with the heat spreader of the invention. That is, the heat sink can be depressed to the extent that effective contact with the heat spreader is assured while enabling the heat sink to return to the desired fully upright position (e.g., as shown in FIG. 1).

Figure 3:
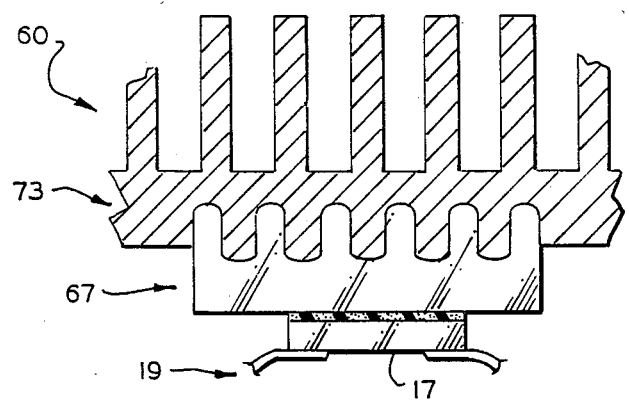
FIG. 3 represents a partial view, partly in section, of an alternative embodiment of the invention.

In FIG. 3, there is shown an electronic package 60 in accordance with an alternative embodiment of the invention. Specifically, the defined heat spreader 67 as used therein and the shown heat sink 73 possess matching curvilinear surfaces in order to provide a curvilinear interface at this juncture. Materials for these components as taught above may be utilized, including the defined adhesive (not shown) along this now greatly extended second interface. The configuration as depicted in FIG. 3 provides even greater heat escapement through the use of such an extended surface area between the two major heat dissipating components of the invention. Assembly of this embodiment of the invention can be accomplished in substantially the same manner as that defined for the embodiment in FIG. 1.

In summary, there has been provided an electronic package which greatly promotes heat removal therefore, thus enabling the utilizatin of high circuit densities as are required in many of today's electronic packages. As defined, the invention combines the use of a thin film, flexible circuitized substrate with an effective heat spreader component to provide a sound means for heat transfer between the invention's heat-generating semiconductor device (e.g., chip) and corresponding heat sink members. The invention accomplishes this effective heat transfer through the use of a large heat spreader possessing a low coefficient of thermal expansion and a relatively high thermal conductivity. In addition, an adhesive also possessing a low coefficient of thermal expansion and corresponding high thermal conductivity is also used to interconnect the device and heat spreader component. As defined herein, the unique arrangement of the invention also greatly facilitates assembly of such a package and thus renders the invention readily adaptable to mass production.

While there have been shown and described what are present considered the preferred embodiments of the invention, it will be obvious to those skilled in the art that various changes and modifications may be made therein without departing from the scope of the invention as defined by the appended claims.

What is claimed is:

1. An electronic package comprising:
   a first circuitized substrate;
   a semiconductor device positioned above said first circuitized substrate and electronically coupled thereto;
   a second, circuitized substrate of flexible nature electrically connected to said first substrate and said semiconductor device for providing said electrical coupling therebetween;
   a heat sink for providing heat escape from said package; and
   a heat spreader for providing an enhanced heat path from said semiconductor device to said heat sink, said heat spreader secured to said seminconductor device and said heat sink along first and second interfaces, respectively, using an adhesive, the coefficients of thermal expansion of said semiconductor device, said heat spreader, and said adhesive used to secure said heat spreader to said device along said first interface being within the range of from about 2.0 to about 5.0 ppm/degree Celsius ($\times 10^{-6}$ m/m degrees Kelvin).

2. The electronic package according to claim 1 wherein said first circuitized substrate is a printed circuit board.

3. The electronic package according to claim 1 wherein said second circuitized substrate of flexible nature comprises a thin, electrically insulative substrate having a defined pattern of electrical circuitry thereon.

4. The electronic package according to claim 3 wherein said thin, electrically insulative substrate is a polymer.

5. The electronic package according to claim 3 wherein said electrical circuitry of said second circuitized substrate includes first and second projecting end portions, said first end portions electrically connected to said semiconductor device and said second end portions electrically connected to the circuitry on said first circuitized substrate.

6. The electronic package according to claim 1 wherein the coefficients of thermal expansion of said semiconductor device and said heat spreader are each about 2.5 ppm/degree Celsius ($\times 10^{-6}$ m/m degrees Kelvin) and the coefficient of thermal expansion of said adhesive used at said first interface is about 3 ppm/degree Celsius ($\times 10^{-6}$ m/m degrees Kelvin).

7. The electronic package according to claim 1 wherein said heat spreader is comprised of a metallic material.

8. The electronic package according to claim 7 wherein said metallic material is copper-clad Invar.

9. The electronic package according to claim 1 wherein the material of said heat spreader is selected from the group consisting of silicon carbide and aluminum nitride.

10. The electronic package according to claim 1 wherein said adhesive along said first interface is electrically insulative.

11. The electronic package according to claim 10 wherein said adhesive along said first interface is diamond-filled epoxy.

12. The electronic package according to claim 1 wherein said heat sink is metallic.

13. The electronic package according to claim 12 wherein said metallic material for said heat sink is selected from the group consisting of aluminum and copper.

14. The electronic package according to claim 1 wherein the overall outer surface area of said heat spreader is at least twice the overall outer surface area of said semiconductor device.

15. The electronic package according to claim 1 wherein the adhesive used along said second interface is substantially thicker than the adhesive used along said first interface.

16. The electronic package according to claim wherein said adhesive used along said second interface is an epoxy having a thermally conductive filler as part thereof.

17. The electronic package according to claim 15 wherein the material of said adhesive used along said second interface is silicone having zinc oxide as said thermally conductive filler.

18. The electronic package according to claim 1 wherein said second interface between said heat sink and said heat spreader is curvilinear in shape.

19. The electronic package according to claim 1 wherein said heat sink is secured to said first circuitized substrate to provide a cover for said semiconductor device.

* * * * *